(12) United States Patent
La

(10) Patent No.: US 6,359,828 B1
(45) Date of Patent: Mar. 19, 2002

(54) COLUMN ADDRESS DECODER AND DECODING METHOD FOR CONTROLLING COLUMN SELECT LINE ENABLE TIME

(75) Inventor: One-gyun La, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/847,789

(22) Filed: May 2, 2001

(30) Foreign Application Priority Data

Oct. 24, 2000 (KR) ........................................ 2000-62607

(51) Int. Cl.[7] ................................................ G11C 8/00
(52) U.S. Cl. .............................. 365/230.06; 365/230.08
(58) Field of Search ....................... 365/230.06, 230.08, 365/203, 233

(56) References Cited

U.S. PATENT DOCUMENTS 6,064,622 A * 5/2000 Lee ........................ 365/230.06
6,115,317 A * 9/2000 Kim ....................... 365/230.06
6,163,498 A * 12/2000 Moon ...................... 365/230.06

* cited by examiner

Primary Examiner—A. Zarabian
(74) Attorney, Agent, or Firm—F. Chau & Associates, LLP

(57) ABSTRACT

Disclosed is a column address decoder of a semiconductor memory device for decoding column addresses to enable a corresponding column select line, the column address decoder comprising a column address pre-decoder for latching combinations of the column addresses when a column select line enable signal is in a first level, and outputting the latched result as pre-decoded column addresses when the column select line enable signal is in a second level and a column address main decoder for combining the pre-decoded column addresses and enabling the corresponding column select line among a plurality of column address select lines.

14 Claims, 8 Drawing Sheets

COLUMN ADDRESS DECODER AND DECODING METHOD FOR CONTROLLING COLUMN SELECT LINE ENABLE TIME

BACKGROUND OF THE INVENTION

1. Field of the Invention

The present invention relates to a semiconductor memory device, and more particularly, to a column address decoder and decoding method for controlling a column select line enable time.

2. Description of the Related Art

Generally, to read data from or write data to a particular memory cell of a semiconductor memory device, the memory cell is addressed by a row address and a column address. In a semiconductor memory device such as a dynamic random access memory (DRAM), an address externally applied together with a write command or a read command is decoded to select a row address and a column address. Generally, to select a column address a column select line (CSL) is used. Data is written after decoding a column address and CSL is enabled upon arrival of the data to be written. When data is read, a row address strobe (RAS) to a column address strobe (CAS) delay time (tRCD) is used for enabling the CSL. The column address decoder is equally divided into a pre-decoder and a main decoder.

FIG. 1 shows a conventional column address pre-decoder of a semiconductor memory device. Referring to FIG. 1, the conventional column address pre-decoder has inverters 100 and 105, and a first through a fourth decoding units 120 through 150. Each decoding unit 120 through 150 has a structure in which NAND gates and inverters are serially connected. Column addresses (CAi, CAj) applied to the inverters 100 and 105 are CMOS-level signals obtained by synchronizing buffered external addresses to a clock signal. A CSL enable signal (PCSLEP) is generated internally in the DRAM for enabling a CSL when a lower bit column address is input. A bank signal (PBANK) corresponding to a bank address is generated when a bank is selected and used to enable a CSL when a higher bit column address is input. Also, pre-decoded column addresses (DCAij, DCAijB, DCAiBj, DCAiBjB) are generated by combining the column addresses (CAi, CAj). Here, i and j represent the numbers of column addresses, and have a value inclusive of and between 0 and N.

The conventional column address pre-decoder shown in FIG. 1 decodes an input signal of a combination of the column addresses (CAi, CAj) or a combination of two or more column addresses, and combines a CSL enable signal (PCSLEP) or a bank signal (PBANK) to the decoded signal to generate a pre-decoded column address (DCAij through DCAiBjB).

FIGS. 2 and 3 are timing diagrams for explaining the operation of the circuit shown in FIG. 1. FIG. 2 shows normal operation, while FIG. 3 shows abnormal operation.

Referring to FIG. 2, pre-decoded column addresses (DCAiBjB, DCAiBj) of (d) and (e) of FIG. 2 are enabled in response to a CSL enable signal (PCSLEP), while column select lines (CSLi, CSLj) of (f) and (g) of FIG. 2 are enabled in response to the pre-decoded column addresses (DCAiBjB, DCAiBj). As shown in FIG. 2, the enable time for the column select lines (CSLi, CSLj) is typically determined only by a CSL enable signal (PCSLEP). In the conventional technology, a CSL enable signal (PCSLEP) is delayed or advanced so that a CSL is enabled at the right time. As can be seen in the Figure, column addresses (CAi, CAj) are enabled when a CSL enable signal (PCSLEP) is low. At low operation speeds, even though a time for generating a CSL enable signal (PCSLEP) is adjusted, the operation can be efficient because column addresses (CAi, CAj) are enabled only when a CSL enable signal (PCSLEP) is low. At high operation speeds, an abnormal operation can occur.

Referring to FIG. 3, when a memory device operates at a high frequency, glitch components 32 and 34 can occur because column addresses (CAi, CAj) are enabled when a CSL enable signal (PCSLEP) is high. The higher the operational frequency and the greater the memory capacity, the longer the path for data to be written to a memory cell and the greater the data line loads. Therefore, the glitch components 32 and 34 can occur in the column select lines (CSLi, CSLj), shown in (e) and (g) of FIG. 3, and cause abnormal operations. As memory capacity and operation speeds increase, clock cycle times (tCC) decrease and it becomes increasingly difficult for the conventional decoding method to coordinate the data input and CSL enable signal. Therefore, a new method that can efficiently enable a CSL for a data input time is needed.

FIGS. 4 and 5 are circuit diagrams of column select line enable circuits disclosed in the U.S. Pat. No. 5,835,441. Referring to FIGS. 4 and 5, the column select line enable circuits coordinate a CSL enablement by using a separation switch 43 and a latch 44. The circuit in FIG. 5 implements a coupling circuit 46 shown in FIG. 4 with an AND gate, and a pre-charge transistor 47 is added to set a latch input, which is different from the circuit in FIG. 4. However, CSL enable circuits of FIGS. 4 and 5 adjust a CSL enable time not from a column address pre-decoder, but in a data path from a column decoder 40 to a column select unit 48. When circuits of FIGS. 4 and 5 are compared to the circuit of FIG. 1, it is seen that the enablement is adjusted only by the CSL enable signal (PCSLEP) in FIG. 1, but in FIGS. 4 and 5, CSL enablement is adjusted by a separation signal (ISO) applied to the separation switch 43 and an enable signal (ENABLE). As a result, the conventional CSL enable circuits shown in FIGS. 4 and 5 are more complex.

SUMMARY OF THE INVENTION

To solve the above problems, it is an object of the present invention to provide a column address decoder of a semiconductor memory device capable of stably enabling a column select line by a simple control signal regardless of the length of a data line. According to an aspect of the invention, a column address decoder of a semiconductor memory device is provided for decoding column addresses to enable a corresponding column select line, the column address decoder comprising a column address pre-decoder for latching combinations of the column addresses when a column select line enable signal is in a first level, and outputting the latched result as pre-decoded column addresses when the column select line enable signal is in a second level and a column address main decoder for combining the pre-decoded column addresses and enabling the corresponding column select line among a plurality of column address select lines.

According to another aspect of the invention, a column address decoding method is provided for decoding column addresses to enable the corresponding column select line, the column address decoding method comprising: determining whether or not a column select line enable signal is in a first level, and if in a first level, latching the combination of the column addresses; determining whether or not the input column address is a lower bit addresses; if the input column addresses are lower bit addresses, combining the latched result with the column select line enable signal and then outputting the combined signal as a pre-decoded column address; if the input column addresses are higher bit addresses, determining whether or not the column select line enable signal is in a second level; and if the column select line enable is in a second level, outputting the latched result as the pre-decoded column address.

According to a preferred embodiment of the invention, a semiconductor memory device is provide which comprises a column address pre-decoder adapted to latch combinations of column addresses when a column select line enable signal is in a first level, and outputting the latched result as pre-decoded column addresses when the column select line enable signal is in a second level; a column address main decoder adapted to decode the pre-decoded column addresses and outputting the decoded result; and a column select line select circuit adapted to enable the corresponding column select line among a plurality of column select lines in response to the decoded result of the column address main decoder.

DETAILED DESCRIPTION OF PREFERRED EMBODIMENTS

Figure 1:
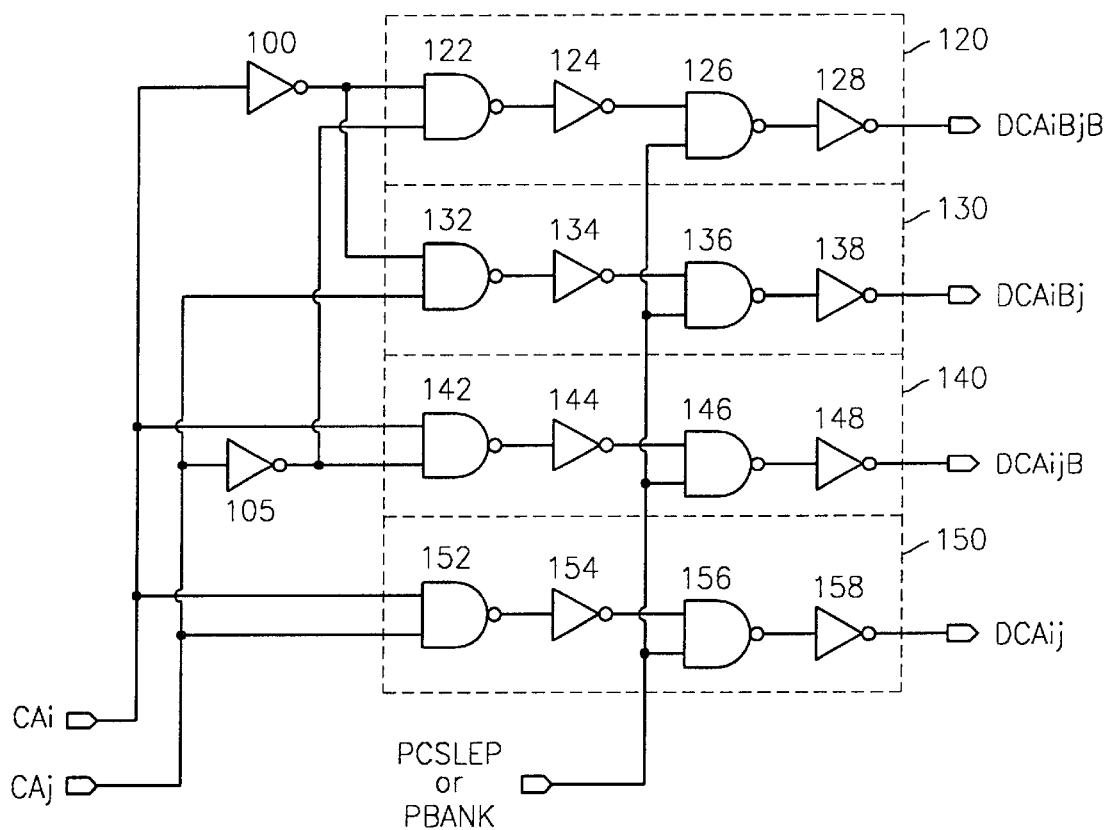
FIG. 1 is a circuit diagram for explaining a conventional column address pre-decoder of a semiconductor memory device.
Figure 2:
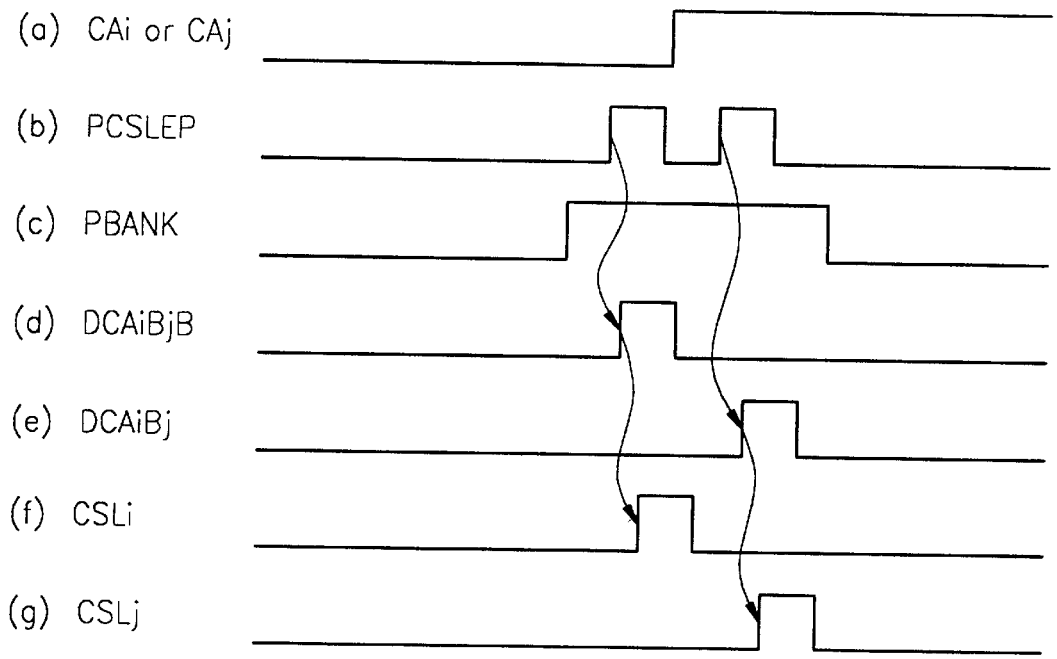
FIGS. 2 and 3 are timing diagrams for explaining the operation of the circuit shown in FIG. 1.
Figure 3:
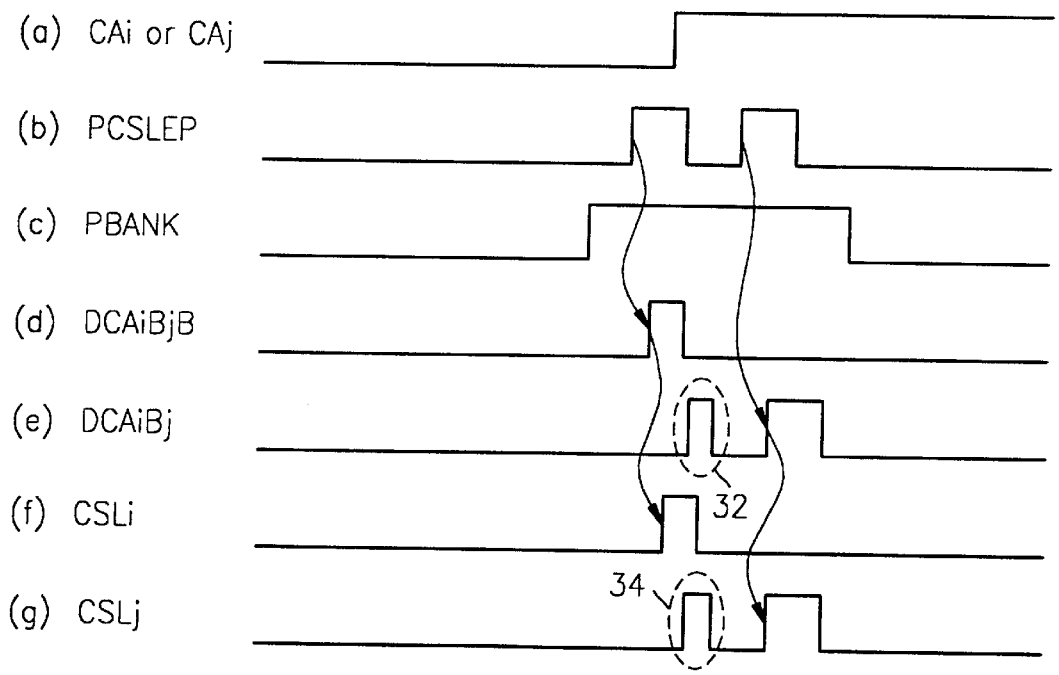
Figure 4:
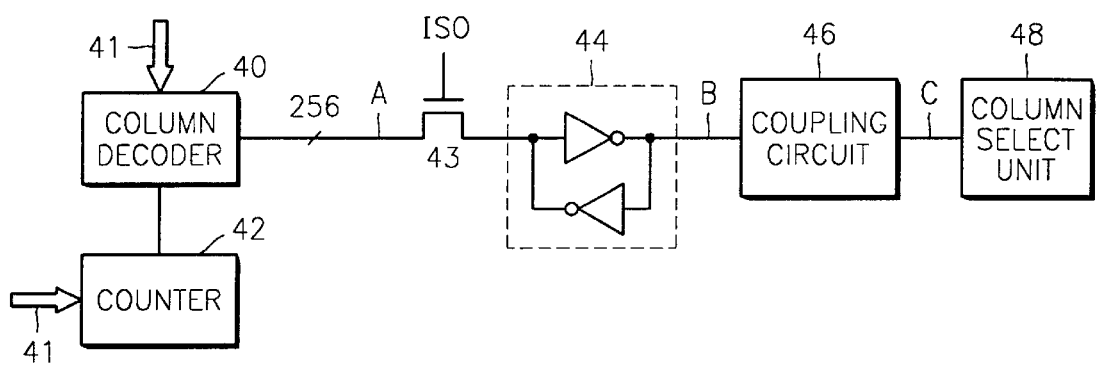
FIGS. 4 and 5 are circuit diagrams for explaining conventional column select line enable circuits.
Figure 5:
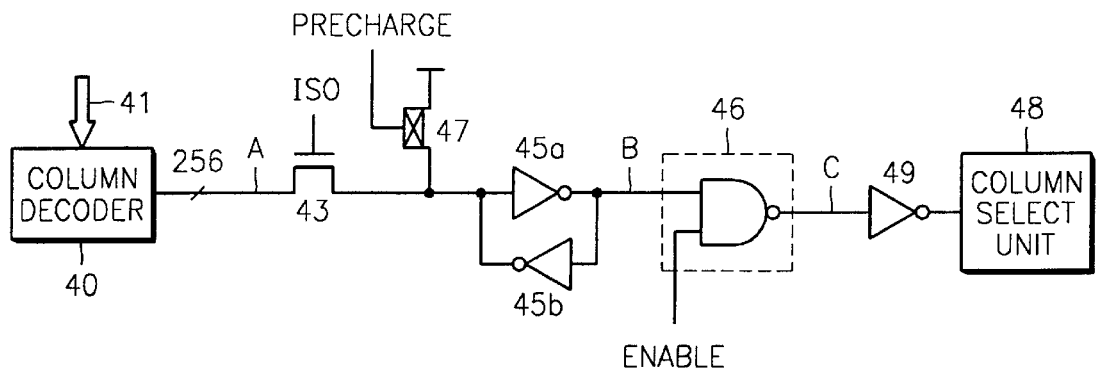
Figure 6:
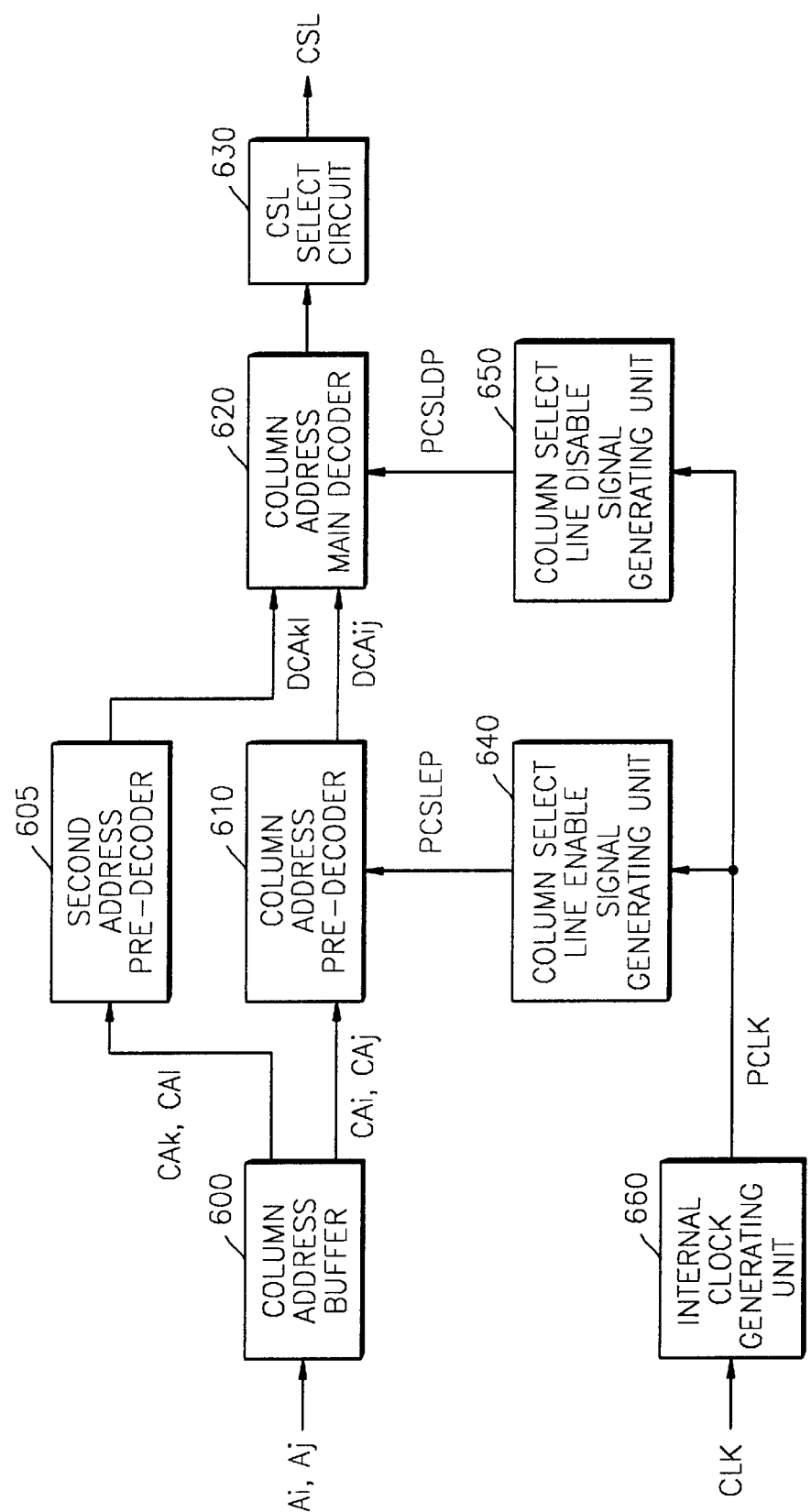
FIG. 6 is a block diagram for explaining a column select line control circuit of a conventional semiconductor memory device.

FIG. 6 is a block diagram showing a typical a column select line control circuit to which a column address decoder is applied. Referring to FIG. 6, a column select line control circuit has a column address buffer 600, a first column address pre-decoder 610, a second column address pre-decoder 605, a column address main decoder 620, a CSL select circuit 630, a column select line enable signal (PCSLEP) generating unit 640, a column select line disable signal (PCSLDP) generating unit 650, and an internal clock generating unit 660.

The internal clock generating unit 660 receives an external clock signal CLK from the outside, and generates an internal clock signal (PCLK) synchronized to the external clock signal (CLK).

In response to the internal clock signal (PCLK), the CSL enable signal generating unit 640 generates a column select line enable signal (PCSLEP) to enable a column select line (CSL). Also, in response to the internal clock signal (PCLK), the column select line disable signal generating unit 650 generates a column select line disable signal (PCSLDP) to disable a CSL.

The column address buffer 600 buffers addresses (Ai, Aj) externally applied, and generates column addresses (CAi, CAj, CAk, CAl) according to the result of buffering. The first column address pre-decoder 610 pre-decodes the column addresses (CAi, CAj) received from the column address buffer 600, in response to the column select line enable signal (PCSLEP), and generates a pre-decoded column address (DCAij) as the result.

The second column address pre-decoder 605 pre-decodes the column addresses (CAk, CAl) provided from the column address buffer 600, in response to the column select line enable signal (PCSLEP), and generates a pre-decoded column address (DCAkl) as the result. The column address pre-decoders according to the present invention will be fully explained with reference to FIGS. 7 through 9.

The column address main decoder 620 combines a plurality of pre-decoded signals and selects a CSL. The column select line disable signal (PCSLDP) of FIG. 6 is a signal used to disable an enabled CSL. The CSL select circuit 630 selects and enables a corresponding column select line (CSL) among a plurality of CSLs, in response to the output from the column address main decoder 620.

Figure 7:
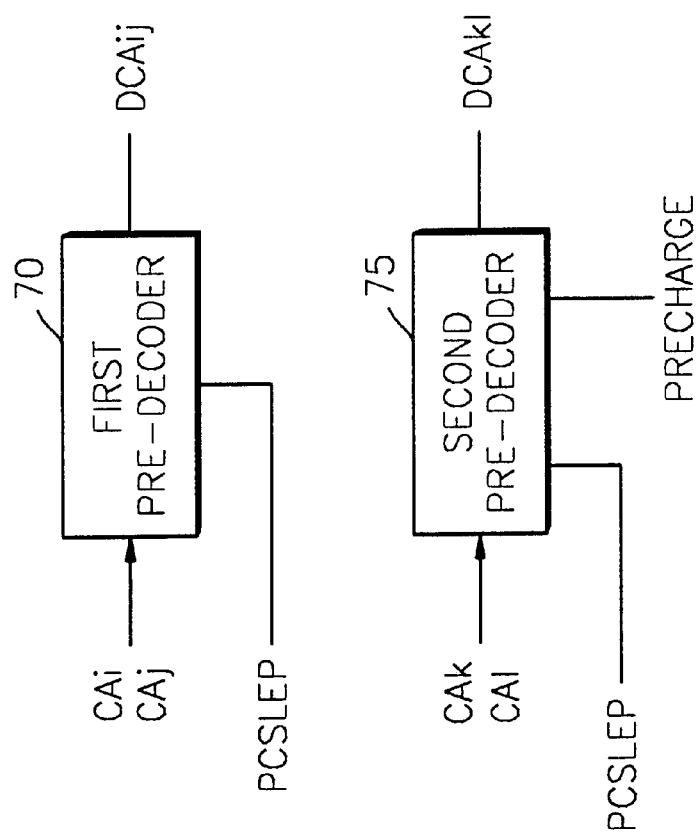
FIG. 7 is a block diagram of a column address pre-decoder of a column address decoder according to the present invention.

FIG. 7 is a block diagram of a column address pre-decoder of column address decoder according to the present invention. The column address pre-decoder is formed of a first pre-decoder 70 and a second pre-decoder 75.

The first pre-decoder 70, in response to a CSL enable signal (PCSLEP), pre-decodes lower bit column addresses (CAi, CAj) among input column addresses, and generates a pre-decoded column address (DCAij). Throughout this specification, lower bit column addresses are represented by i and j. Here, each of i and j are numbers indicating the number of column addresses, and is set to a value inclusive of and between 0 and N. Also, though the pre-decoded column address is represented as DCAij in FIG. 7, the pre-decoded column address can be represented as DCAijB, DCAiBj, DCAijB, and DCAiBjB, by combining CAi and CAj.

The second pre-decoder 75, in response to the CSL enable signal (PCSLEP), pre-decodes higher bit column addresses (CAk, CAl) among the input column addresses, and generates a pre-decoded column address (DCAkl). In this description, a higher bit column addresses are represented by k and l.

Referring to FIG. 7, each of the first pre-decoder 70 and the second pre-decoder 75 of the column address pre-decoder latches a column address according to the level state of a CSL enable signal (PCSLEP), and outputs the latched signal as the pre-decoded column address. That is, when the CSL enable signal (PCSLEP) is in a low level, the first pre-decoder 70 and the second pre-decoder 75 receives input signals of a combination of the column addresses (CAi, CAj) and a combination of the column addresses (CAk, CAl), and latches the input signals. Therefore, the column addresses are sampled and latched when the CSL enable signal (PCSLEP) is in a low level.

Also, a CSL is enabled by combining pre-decoded addresses (DCAij, DCAkl). Here, the pre-decoded lower bit column addresses are sequentially enabled by the CSL enable signal (PCSLEP). Meanwhile, after enabled by the CSL enable signal (PCSLEP), the pre-decoded higher bit column addresses are maintained at a high level during a time when the pre-decoded lower bit column addresses are sequentially enabled, and then disabled.

Figure 8:
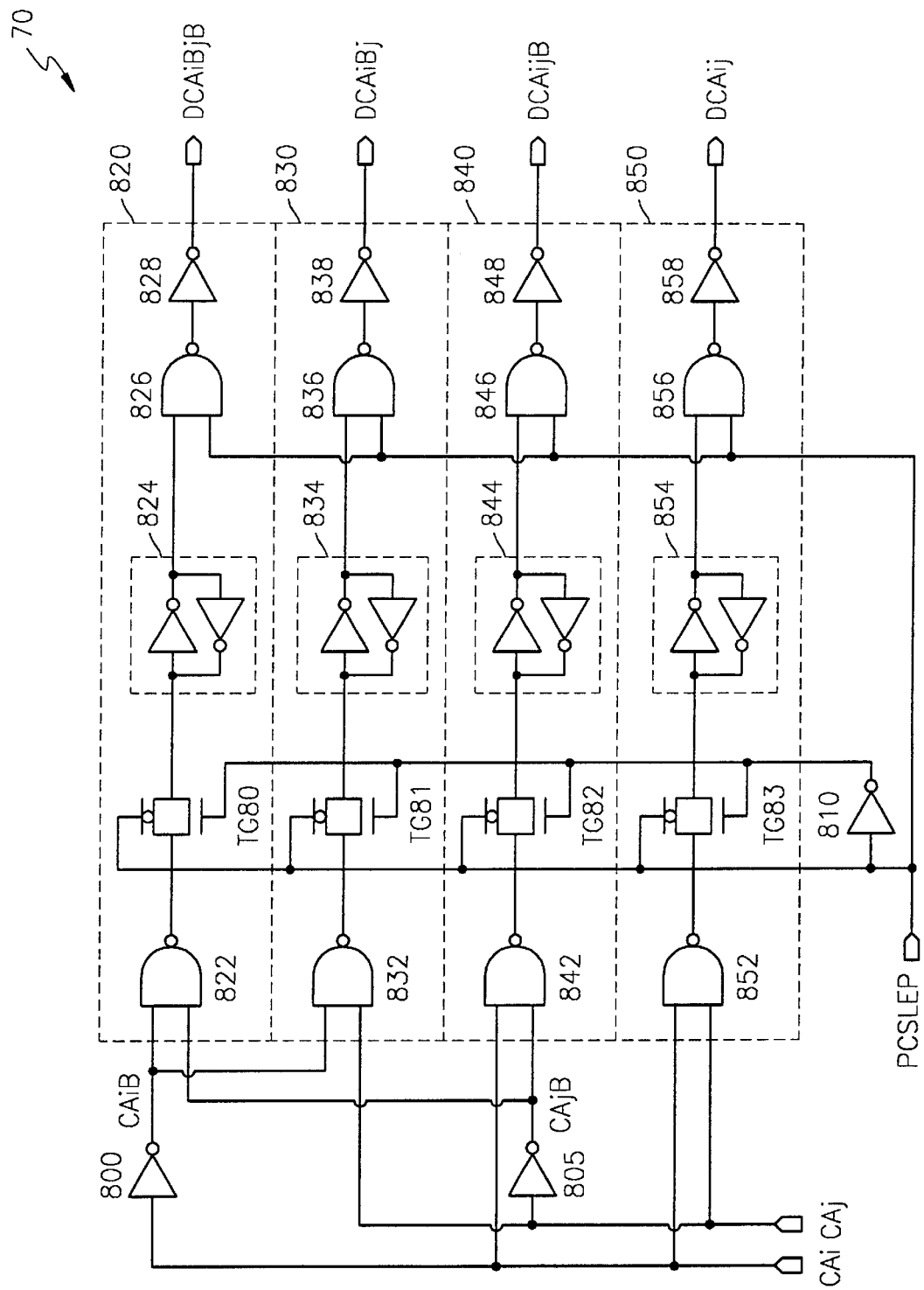
FIG. 8 is a circuit diagram of a column address pre-decoder according to an embodiment of the present invention.

FIG. 8 is a circuit diagram for explaining a column address pre-decoder according to an embodiment of the present invention. The column address pre-decoder of FIG. 8 can be regarded as an implementation of the first pre-decoder 70 of FIG. 7 and has inverters 800, 805 and 810, and a first decoding unit through a fourth decoding unit 820 through 850.

The inverters 800 and 805 invert the column addresses (CAi, CAj) and output inverted column addresses (CAiB, CAjB). The inverter 810 inverts the CSL enable signal (PCSLEP).

In response to the CSL enable signal (PCSLEP), each of the first decoding unit through the fourth decoding unit 820 through 850 latches logically combined signals of two signals among column addresses (CAi, CAj) and inverted column addresses (CAiB, CAjB), and logically combines the latched signals and the CSL enable signal (PCSLEP) to generate the pre-decoded column addresses (DCAij, DCAijB, DCAiBj, DCAiBjB).

First, the structure of the first decoding unit 820 will now be explained. The first decoding unit 820 has a NAND gate 822, a transmission gate TG80, a latch 824, a NAND gate 826, and an inverter 828. The NAND gate 822 inverts and logical ANDs the inverted column address (CAiB) and the inverted column address (CAjB), and outputs the inverted and logical ANDed result. The transmission gate TG80, in response to the CSL enable signal (PCSLEP) and an inverted CSL enable signal, transmits the output signal of the NAND gate 822. The latch 824 is formed of two inverters, of which outputs are input to each other, and latches the NAND gate 822, provided through the transmission gate TG80. Here, the latch 824 can be named as a storage means, and a D-latch or a D flip-flop can be used as the latch 824. The NAND gate 826 inverts and logical ANDs the output signal of the latch 824 and the CSL enable signal (PCSLEP), and outputs a inverted and logical ANDed signal. The inverter 828 inverts the output signal of the NAND gate 826 and generates the pre-decoded column address (DCAiBjB).

The second decoding unit 830 has a NAND gate 832, a transmission gate TG81, a latch 834, a NAND gate 836, and an inverter 838. The structure of the second decoding unit 830 is similar to that of the first decoding unit 820, and therefore the explanation will be omitted. However, the second decoding unit 830 is different from the first decoding unit 820 in that the input signals to the NAND gate 832 are the inverted column address (CAiB) and the column address (CAj), and the output signal is a pre-decoded column address (CDAiBj).

The third decoding unit 840 has a NAND gate 842, a transmission gate TG82, a latch 844, a NAND gate 846, and an inverter 848. The input signals of the third decoding unit 840 are the column address (CAi) and the inverted column address (CAjB), and the output signal is a pre-decoded column address (DCAijB).

The fourth decoding unit 850 has a NAND gate 852, a transmission gate TG83, a latch 854, a NAND gate 856, and an inverter 858. The input signals of the fourth decoding unit 850 are column addresses (CAi, CAj), and the output signal is a pre-decoded column address (DCAij).

More specifically, the operation of the column address pre-decoder 70 shown in FIG. 8 will now be explained. The NAND gates 822, 832, 842, and 852 of each decoding unit 820 through 850 invert and logical ANDs two signals among column addresses and inverted column addresses. At this time, if a CSL enable signal (PCSLEP) is in a low level, transmission gates TG80 through TG83 are turned on. For example, if column addresses (CAi, CAj) are all in a low level, the output signal of the NAND gate 822 is in a low level, and the output signal is provided to the latch 824 through the turned-on transmission gate TG80. The output signal of the latch 824 is transmitted to a high level, and since the CSL enable signal (PCSLEP) is in a low level, the pre-decoded column address (DCAiBjB) is transmitted to a low level. At this time, if a CSL enable signal (PCSLEP) is moved to a high level, the transmission gate TG80 is turned off, and the output signal of the NAND gate 822 is not provided. Also, the output signal of the NAND gate 826 is transmitted to a low level by the high level CSL enable signal (PCSLEP), the pre-decoded column address (DCAiBjB) output through the inverter 858 is transmitted to a high level. That is, during a time period when the CSL enable signal (PCSLEP) is in a high level, the pre-decoded column address (DCAiBjB) is enabled to high, and, if the CSL enable signal (PCSLEP) is transmitted to a low level again, is transmitted to a low level. As this, during a time when the CSL enable signal (PCSLEP) is in a low level, the pre-decoder 70 latches a column address, and combines the latched signal with the CSL enable signal (PCSLEP) to output as a pre-decoded column address.

Likewise, if the column address (CAi) is in a low level, and the column address (CAj) is in a high level, the output signal of the NAND gate 832 is transmitted to a low level. That is, when the CSL enable signal (PCSLEP) is in a low level, the transmission gate TG81 is turned on and provides the output signal of the NAND gate 832 to the latch 834. At this time, if the CSL enable signal (PCSLEP) is transmitted to a high level, the transmission gate TG81 is turned off. That is, the output signal of the NAND gate 836 is transmitted to a low level by a high level output signal of the latch 834 and a high level CSL enable signal (PCSELP). Therefore, the pre-decoded column address (DCAiBj) output through the inverter 838 is transmitted to a high level and enabled. The remaining pre-decoded column addresses (DCAijB, DCAij) are also enabled by repeating the above-described processes in the third decoding unit 840 and the fourth decoding unit 850.

If it is assumed that the column addresses (CAi, CAj) are CA1, and CA2, respectively, in the embodiment of FIG. 8, the decoded column addresses can be represented by DCA12, DCA12B, DCA1B2, and DCA1B2B. For example, if CA1 and CA2 are all "0", DCA1B2B is enabled, and if CA1 is "0" and CA2 is "1", DCA1B2 is enabled. Likewise, if CA1 is "1" and CA2 is "0", DCA12B is enabled, and if CA1 and CA2 are all "1", DCA12 is enabled.

In the column address pre-decoder 70 of FIG. 8, pre-decoded column addresses are enabled at a time when each pulse of the CSL enable signal (PCSLEP) is rising, and maintained in a high level during a time period when a CSL enable signal (PCSLEP) is in a high level. Here, the pulse number of CSL enable signal (PCSLEP) is equal to the length of a burst in an ordinary synchronous DRAM (SDRAM). Also, in a double data rate (DDR) DRAM, the pulse number of the CSL enable signal (PCSLEP) is half the length of a burst.

Figure 9:
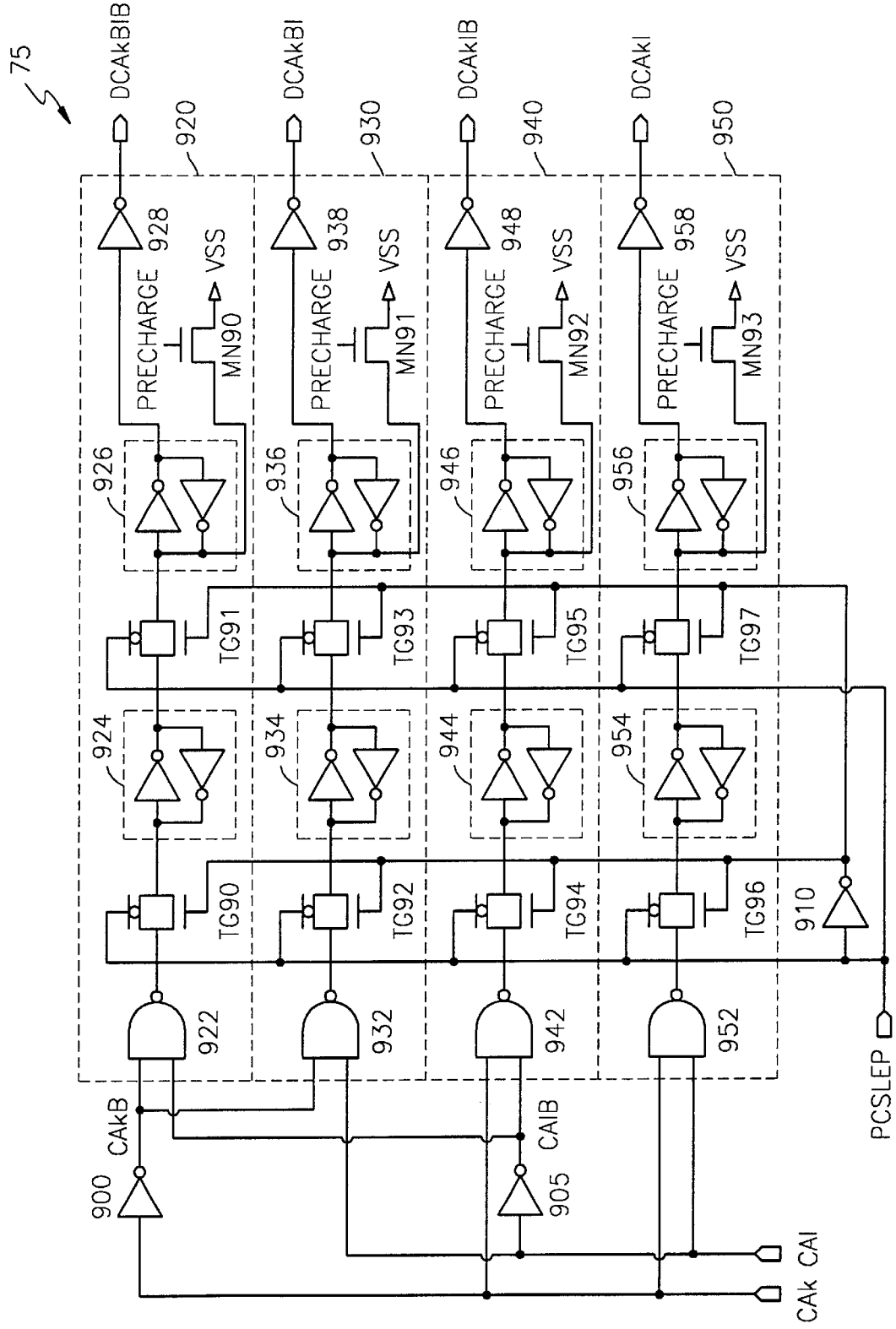
FIG. 9 is a circuit diagram of a column address pre-decoder according to another embodiment of the present invention.

FIG. 9 is a circuit diagram for explaining a column address pre-decoder according to another embodiment of the present invention. Referring to FIG. 9, the column address pre-decoder can be regarded as the second pre-decoder 75 of FIG. 7, and has inverters 900, 905 and 910, and a first decoding unit through a fourth decoding unit 920 through 950.

The inverters 900 and 905 invert column addresses (CAk, CAl), and output inverted column addresses (CAkB, CAlB). The inverter 910 inverts the CSL enable signal (PCSLEP) and outputs the inverted signal.

In response to the CSL enable signal (PCSLEP), each of the first decoding unit through the fourth decoding unit 920 through 950 latches the combined signals of the column addresses (CAk, CAl) and inverted column addresses (CAkB, CAlB) and generates pre-decoded column addresses (CDAkBlB, DCAklB, DCAklB, DCAkl). Also, each of the first decoding unit through the fourth decoding unit 920 through 950 disables the pre-decoded column addresses in response to a precharge signal PRECHARGE.

First, the structure of the first decoding unit 920 will now be explained. The first decoding unit 920 has a NAND gate 922, transmission gates TG90 and TG91, latches 924 and 926, an inverter 928, and an NMOS transistor MN90. The NAND gate 922 inverts and logical ANDs the inverted column address (CAkB) and the inverted column address (CAlB), and outputs the inverted and logical ANDed result. The transmission gate TG90, in response to the CSL enable signal (PCSLEP) and an inverted CSL enable signal, transmits the output signal of the NAND gate 922.

Here, the transmission gate TG90 is turned on when the CSL enable signal (PCSLEP) is in a low level, and turned off when the CSL enable signal (PCSLEP) is in a high level. The latch 924 is formed of two inverters, of which outputs are input to each other, and latches a signal input through the transmission gate TG90. The transmission gate TG91, in response to the CSL enable signal (PCSLEP) and an inverted CSL enable signal, transmits the output signal of the latch 924. The latch 926 latches the output signal of the latch 924, provided through the transmission gate TG91. The inverter 928 inverts the output signal of the latch 926 and generates a pre-decoded column address (DCAkBlB). Also, in the NMOS transistor MN90, a precharge signal (PRECHARGE) is connected to a gate, the drain is connected to the input signal of the latch 926, and the source is connected to a ground (VSS). Therefore, the NMOS transistor is turned on when the precharge signal (PRECHARGE) is in a high level, and at this time, the pre-decoded column address (DCAkBlB) is controlled to be in a low level. In the present invention, higher bit column addresses are not controlled by a bank signal (PBANK), but, as in the lower bit column addresses, by the CSL enable signal (PCSLEP) and the precharge signal (PRECHARGE). Therefore, compared to the conventional pre-decoders, control signals of the present invention are simplified.

The structure of each of the second decoding unit through the fourth decoding unit 930 through 950 is similar to that of the first decoding unit 920 and therefore the explanation will be omitted. However, the signals input to the second decoding unit 930 are an inverted column address (CAkB) and a column address (CAl), and the output signal is a pre-decoded column address (DCAkBl). Also, the signals input to the third decoding unit 940 are a column address (CAk) and an inverted column address (CAlB), and the output signal is a pre-decoded column address (DCAKlB). The signals input to the fourth decoding unit 950 are column addresses (CAk, CAl), and the output signal is a pre-decoded column address (DCAkl).

More specifically, the operation of the column address pre-decoder 75 shown in FIG. 9 will now be explained. First, two signals among column addresses (CAk, CAl) and inverted column addresses (CAkB, CAlB) input through a column address buffer (not shown) are inverted and logical ANDed in the NAND gates 922, 932, 942, and 952 of each decoding unit 920 through 950. Here, if the CSL enable signal (PCSLEP) is in a low level, transmission gates TG90, TG92, TG94, and TG96 are turned on, and the output signal of each NAND gate 922 through 952 is transmitted to each latch 924 through 954 through the turned-on transmission gates TG90, TG92, TG94 and TG96.

For example, when both CAk and CAl are set to a high level, the output signal of the NAND gate 952 of the fourth decoding unit 950 is transmitted to a low level. That is, when the CSL enable signal (PCSLEP) is in a low level, the transmission gate TG96 is turned on and the output signal of the NAND gate 952 is transmitted to the latch 954. At this time, since the transmission gate TG97 is turned off, the output signal of the latch 954 is not transmitted. Also, if the CSL enable signal (PCSLEP) is transmitted to a high level, the transmission gate TG97 is turned on and the output signal of the latch 954 is transmitted to the latch 956. Therefore, through the latch 956 and the inverter 958, the pre-decoded column address (DCAkl) is transmitted to a high level and enabled. At this time, if a CSL enable signal (PCSLEP) is transmitted to a low level again, the latch 954 latches the output signal of the NAND gate 952, but the transmission gate TG97 is not turned on, and therefore, the pre-decoded column address (DCAkl) maintains the previous state. Also, the precharge signal (PRECHARGE) is transmitted to a high level, the pre-decoded column address (DCAkl) is moved to a low level.

That is, since the higher bit pre-decoded column addresses have a narrower variation scope than that of lower bit addresses, the higher bit pre-decoded column addresses are maintained in a high level during a time when lower bit column addresses are enabled sequentially. Therefore, next write command or a read command is applied, the next higher bit addresses are pre-decoded and output as pre-decoded column addresses.

Figure 10:
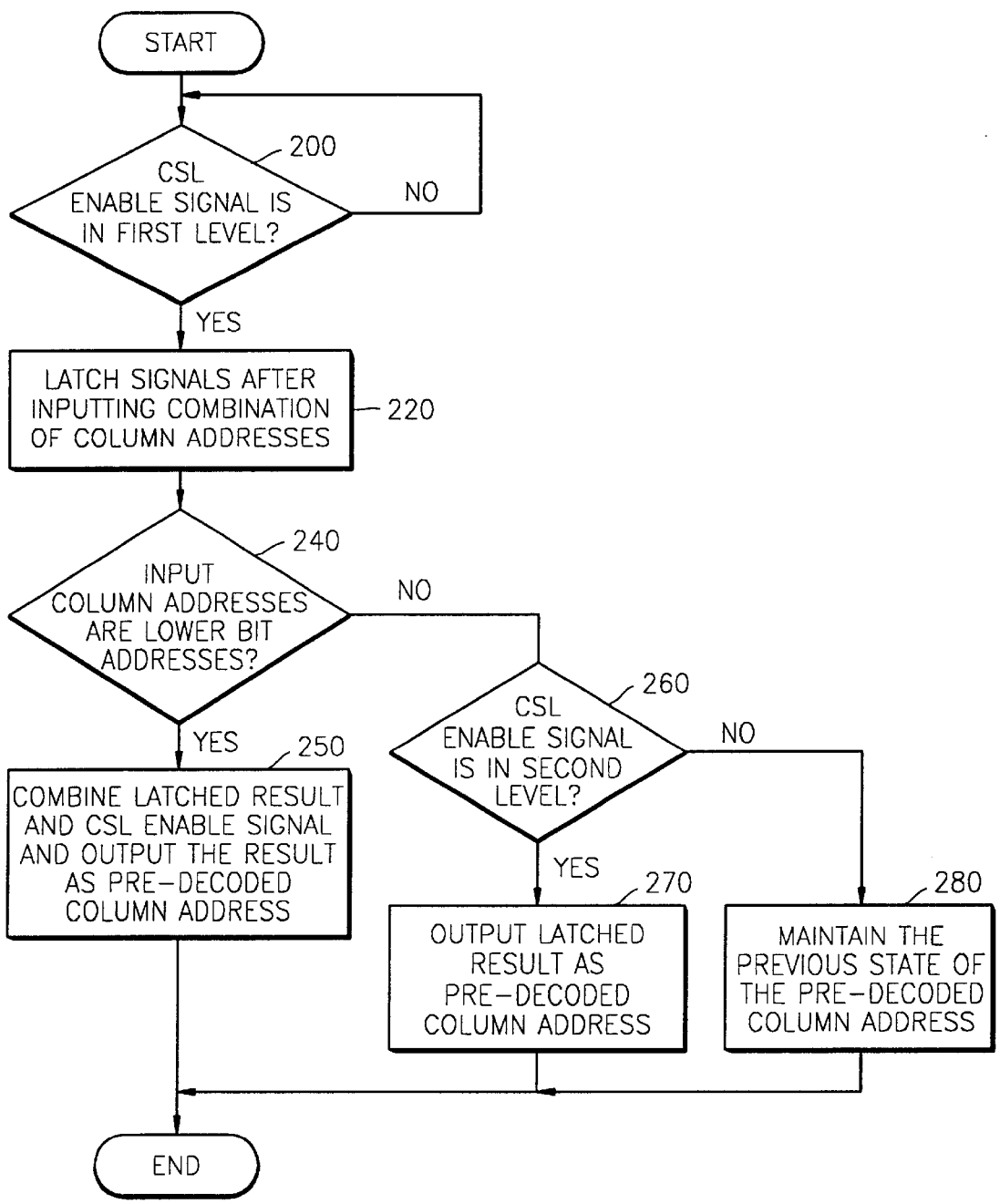
FIG. 10 is a flowchart of a column address decoding method according to the present invention.

FIG. 10 is a flowchart for explaining a column address decoding method according to the present invention.

Referring to FIGS. 8 through 10, a column address decoding method according to the present invention will now be explained in detail. First, whether or not the CSL enable signal (PCSLEP) is in a first level is determined in step 200. Here, it can be assumed that the first level is a low level. Therefore, when the CSL enable signal (PCSLEP) is in a low level, a combination of the column addresses is input and latched in step 220. Referring to FIGS. 8 and 9, column addresses are CAi, CAj, or CAk, CAl, and inside each decoding unit, input addresses are combined and latched. At this time, whether or not the input column addresses are lower bit addresses is determined in step 240. If the column addresses are determined as the lower bit addresses in the step 240, the latched result in the step 220 is combined with the CSL enable signal (PCSLEP) and output as a pre-decoded column address in step 250.

Also, if the input column addresses are determined as higher bit addresses in the step 240, whether or not the CSL enable signal (PCSLEP) is a second level is determined in step 260. Here, the second level can be set to, for example, a high level. That is, if the CSL enable signal (PCSLEP) is transmitted to a high level in the step 260, the latched result in the step 220 is output as a pre-decoded column address in step 270. Also, if the CSL enable signal (PCSLEP) is not transmitted to a high level, the transmission gates TG91, TG93, TG95, TG97 are turned off, and therefore the pre-decoded column address is maintained in the previous state in step 280.

As described above, the column address pre-decoder of the present invention can stably adjust a CSL enable time for data input time. That is, a timing margin for an input time of each column address for the CSL enable signal (PCSLEP) increases. More specifically, compared to the conventional column address pre-decoder, the column address pre-decoder of the present invention enables a column address input time not only in a low level sector of the CSL enable signal (PCSLEP), but also in a high level sector of the CSL enable signal (PCSLEP). Therefore, even though the capacity of a memory increases and a data path lengthens, a CSL enable time can be adjusted.

So far, optimum embodiments are explained in the drawings and specification, and though specific terminologies are used here, those were only to explain the present invention. Therefore, the present invention is not restricted to the above-described embodiments and many variations are possible within the spirit and scope of the present invention. The scope of the present invention is not determined by the description but by the accompanying claims.

According to the present invention, by a CSL enable signal (PCSLEP) for enabling a column select line, a column address is latched and an output time of the pre-decoded column address is determined, and therefore a CSL enable time can be stably adjusted. Also, since an enable time of a CSL is controlled only by a CSL enable signal, a control signal can be simplified, and even though the capacity of a memory increases and a data path lengthens, a CSL can be accurately enabled without abnormal operations.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A column address decoder of a semiconductor memory device for decoding column addresses to enable a corresponding column select line, the column address decoder comprising:
    a column address pre-decoder for latching combinations of the column addresses when a column select line enable signal is in a first level, and outputting the latched result as pre-decoded column addresses when the column select line enable signal is in a second level; and
    wherein the column address pre-decoder comprises a first decoding unit through an Nth decoding unit for pre-decoding the input column addresses; and each of the first decoding unit through the Nth decoding unit comprises:
        a first inverting and logical AND means for inverting and logical ANDs at least two signals of the column addresses and inverted column addresses;
        a transmission gate for transmitting the output of the first inverting and logical AND means in response to the column select line enable signal;
        a latch for latching the signal transmitted through the transmission gate and outputting the latched result;
        a second inverting and logical AND means for inverting and logical AND the output signal of the latch and the column select line enable signal, and outputting the inverted and logical ANDed signal; and
        an inverter for inverting the output of the second inverting and logical AND means and outputting the inverted result as the pre-decoded column address.

2. The column address decoder of claim 1, wherein the column address pre-decoder decodes the lower bit addresses of the input column addresses.

3. A column address decoder of a semiconductor memory device for decoding column addresses to enable a corresponding column select line, the column address decoder comprising:
    a column address pre-decoder for latching combinations of the column addresses when a column select line enable signal is in a first level, and outputting the latched result as pre-decoded column addresses when the column select line enable signal is in a second level; and
    wherein the column address pre-decoder comprises a first decoding unit through an Nth decoding unit for pre-decoding the input column addresses; and each of the first decoding unit through the Nth decoding unit comprises:
        a first inverting and logical AND means for inverting and logical ANDs at least two signals of the column addresses and inverted column addresses;
        a first transmission gate for transmitting the output of the first inverting and logical AND means in response to the column select line enable signal;
        a first latch for latching the output of the first inverting and logical AND means transmitted through the first transmission gate;
        a second transmission gate for transmitting the output of the first latch in response to the column select line enable signal;
        a second latch for latching the output of the first latch, transmitted through the second transmission gate; and
        an inverter for inverting the output signal of the second latch and outputting the inverted result as the pre-decoded column address.

4. The column address decoder of claim 3, wherein each of the first decoding unit through the Nth decoding unit further comprises a MOS transistor of which drain is connected to the input of the second latch, and of which gate is connected to a predetermined precharge signal, and which is on or off in response to the precharge signal.

5. The column address decoder of claim 3, wherein the column address pre-decoder decodes the higher bit addresses of the input column addresses.

6. The column address decoder of claim 1, wherein the column address pre-decoder farther comprises:
    a first pre-decoder for pre-decoding the lower bit addresses of the column addresses in response to the column select line enable signal; and
    a second pre-decoder for pre-decoding the higher bit addresses of the column addresses in response to the column select line enable signal.

7. A column address decoding method for decoding column addresses to enable the corresponding column select line, the column address decoding method comprising:
    (a) determining whether or not a column select line enable signal is in a first level, and if in a first level, latching the combination of the column addresses;

(b) determining whether or not the input column address is a lower bit addresses;

(c) if the input column addresses are lower bit addresses, combining the latched result with the column select line enable signal and then outputting the combined signal as a pre-decoded column address;

(d) if the input column addresses are higher bit addresses, determining whether or not the column select line enable signal is in a second level; and (e) if the column select line enable is in a second level, outputting the latched result as the pre-decoded column address.

8. The column address decoding method of claim 7, wherein said pre-decoded column address is disabled by a precharge signal if the column select line enable is in said second level.

9. The column address decoding method of claim 7, further comprising the step of:

maintaining the previous state of pre-decoded column address if, in the step (d), the column select line enable signal is not in a second level.

10. A semiconductor memory device comprising:

a column address pre-decoder adapted to latch combinations of column addresses when a column select line enable signal is in a first level, and outputting the latched result as pre-decoded column addresses when the column select line enable signal is in a second level;

said column address pre-decoder comprising a first pre-decoder for pre-decoding the lower bit addresses of the column addresses in response to the column select line enable signal, and a second pre-decoder for pre-decoding the higher bit addresses of the column addresses in response to the column select line enable signal;

a column address main decoder adapted to decode the pre-decoded column addresses and outputting the decoded result; and a column select line select circuit adapted to enable the corresponding column select line among a plurality of column select lines in response to the decoded result of the column address main decoder.

11. The column address decoder of claim 1 further comprising:

a column address main decoder for combining the pre-decoded column addresses and enabling the corresponding column select line among a plurality of column address select lines.

12. The column address decoder of claim 3 further comprising:

a column address main decoder for combining the pre-decoded column addresses and enabling the corresponding column select line among a plurality of column address select lines.

13. A column address decoder of a semiconductor memory device for decoding column addresses to enable a corresponding column select line, the column address decoder comprising:

a column address pre-decoder for latching combinations of the column addresses when a column select line enable signal is in a first level, and outputting the latched result as pre-decoded column addresses when the column select line enable signal is in a second level;

said column address pre-decoder comprising a first pre-decoder for pre-decoding the lower bit addresses of the column addresses in response to the column select line enable signal, and a second pre-decoder for pre-decoding the higher bit addresses of the column addresses in response to the column select line enable signal; and a column address main decoder for combining the pre-decoded column addresses and enabling the corresponding column select line among a plurality of column address select lines.

14. A semiconductor memory device comprising:

a column address pre-decoder adapted to latch combinations of column addresses when a column select line enable signal is in a first level, and outputting the latched result as pre-decoded column addresses when the column select line enable signal is in a second level;

a column address main decoder adapted to decode the pre-decoded column addresses and outputting the decoded result;

a column select line select circuit adapted to enable the corresponding column select line among a plurality of column select lines in response to the decoded result of the column address main decoder; and wherein the column address pre-decoder comprises a first decoding unit through an Nth decoding unit for pre-decoding the input column addresses; and each of the first decoding unit through the Nth decoding unit comprises:

a first inverting and logical AND means for inverting and logical ANDs at least two signals of the column addresses and inverted column addresses;

a transmission gate for transmitting the output of the first inverting and logical AND means in response to the column select line enable signal;

a latch for latching the signal transmitted through the transmission gate and outputting the latched result;

a second inverting and logical AND means for inverting and logical AND the output signal of the latch and the column select line enable signal, and outputting the inverted and logical ANDed signal; and an inverter for inverting the output of the second inverting and logical AND means and outputting the inverted result as the pre-decoded column address.

* * * * *